(12) United States Patent
Tsorng et al.

(10) Patent No.: US 10,624,223 B1
(45) Date of Patent: Apr. 14, 2020

(54) COVER APPARATUS FOR SERVER CHASSIS

(71) Applicant: QUANTA COMPUTER INC., Taoyuan (TW)

(72) Inventors: Yaw-Tzorng Tsorng, Taoyuan (TW); Chun Chang, Taoyuan (TW); Zhi-Hao Tseng, Taoyuan (TW); Yu-Cheng Chang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/419,828

(22) Filed: May 22, 2019

(51) Int. Cl.
- *H05K 5/03* (2006.01)
- *H05K 7/20* (2006.01)
- *H05K 7/14* (2006.01)
- *H05K 5/02* (2006.01)

(52) U.S. Cl.
CPC .............. *H05K 5/03* (2013.01); *H05K 5/023* (2013.01); *H05K 5/0221* (2013.01); *H05K 7/1487* (2013.01); *H05K 7/1488* (2013.01); *H05K 7/20172* (2013.01); *H05K 7/20727* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,530,620 A | * | 6/1996 | Sangveraphunsiri | ........................ G06F 13/4063 361/679.33 |
| 5,886,868 A | * | 3/1999 | White | ..................... H02B 1/066 361/652 |
| 6,407,912 B1 | * | 6/2002 | Chen | ........................ G06F 1/181 312/223.1 |
| 6,711,009 B2 | * | 3/2004 | Lee | .......................... G06F 1/181 248/551 |
| 6,721,183 B1 | * | 4/2004 | Chen | ........................ G06F 1/181 16/404 |
| 6,788,542 B2 | * | 9/2004 | Rumney | ............... H05K 7/1421 361/724 |
| 6,795,307 B2 | * | 9/2004 | Arbogast | .............. E05B 65/006 292/175 |
| 7,911,788 B2 | * | 3/2011 | Sasagawa | ........... H05K 7/20736 165/104.34 |
| 8,279,596 B2 | * | 10/2012 | Rodriguez | ................. G06F 1/20 312/223.2 |
| 8,363,414 B2 | * | 1/2013 | Peng | ........................ G06F 1/181 312/223.1 |
| 8,498,119 B2 | * | 7/2013 | Fan | .......................... E05C 1/004 361/724 |
| 9,055,689 B2 | * | 6/2015 | Yu | ......................... H05K 5/0226 |
| 9,497,881 B2 | * | 11/2016 | Chen | ..................... H05K 7/1487 |
| 9,955,606 B2 | * | 4/2018 | Chen | ..................... G11B 33/142 |

(Continued)

*Primary Examiner* — Lisa Lea-Edmonds
(74) *Attorney, Agent, or Firm* — Nixon Peabody LLP; Zhou Lu

(57) ABSTRACT

The present disclosure provides a cover apparatus including a top cover and a sub-cover. The top cover is received by the chassis body and extends over a full length and width of the chassis body. The sub-cover is coupled to the top cover, and comprises a locking mechanism. The sub-cover is configured to alternate between an open position and a closed position. In the open position, the sub-cover allows access to at least one component housed within the chassis body.

20 Claims, 7 Drawing Sheets

(56) References Cited

U.S. PATENT DOCUMENTS

| | | | |
|---|---|---|---|
| 2005/0013105 A1* | 1/2005 | Lin | G06F 1/181 |
| | | | 361/679.58 |
| 2005/0036287 A2* | 2/2005 | Kosugi | F04D 19/007 |
| | | | 361/695 |
| 2009/0180252 A1* | 7/2009 | Lv | H05K 7/20727 |
| | | | 361/695 |
| 2010/0007252 A1* | 1/2010 | Liu | G06F 1/183 |
| | | | 312/223.2 |
| 2011/0149524 A1* | 6/2011 | Westphall | H05K 7/1425 |
| | | | 361/725 |
| 2013/0111098 A1* | 5/2013 | Li | G06F 1/188 |
| | | | 710/305 |
| 2014/0002986 A1* | 1/2014 | Guan | G06F 1/183 |
| | | | 361/679.48 |
| 2014/0118938 A1* | 5/2014 | Lin | H05K 7/20172 |
| | | | 361/695 |
| 2017/0235347 A1* | 8/2017 | Heyd | G11B 33/128 |
| | | | 361/679.31 |
| 2017/0280581 A1* | 9/2017 | Hesse | H05K 7/1488 |
| 2017/0367210 A1* | 12/2017 | Chen | H05K 7/1447 |

\* cited by examiner

COVER APPARATUS FOR SERVER CHASSIS

FIELD

The present disclosure relates to a cover apparatus for a server chassis.

BACKGROUND

Computer chassis can be used in rack systems to hold a variety of computer components and of many different sizes. Computer chassis typically have an individual cover, which serves to help regulate temperature within the server chassis. The cover also protects the components from dust, bugs, and external air circulation. Poor temperature regulation, bugs, and dust can all cause damage to computer components, which leads to failure of the computer system.

Users often need to switch out particular components from the chassis body while leaving the remainder of the components in their original location; for example, when a computer component has failed or needs to be replaced with a new model. In some examples, the components need to be switched out while the computer chassis is still operational. Conventional chassis covers typically require the user to remove the entire cover in order to replace a component. This can be burdensome, and can interfere with ease of access to particular computer components. The problem is exacerbated when the user needs to replace the same component from a variety of computer chassis. In each example, the user has to remove the cover, set-down the cover somewhere, replace the component, and replace the cover.

Therefore, what is needed are apparatuses that reduce the burden on a user replacing computer components within a server chassis.

SUMMARY

The various examples of the present disclosure are directed towards a cover apparatus for a chassis body. In a first embodiment, the present disclosure provides for a cover apparatus, including a top cover and a sub-cover. The top cover is received by the chassis body, and extends over a full length and width of the chassis body. The sub-cover is coupled to the top cover, and comprises a locking mechanism. The sub-cover is configured to alternate between an open position and a closed position. In the open position, the sub-cover allows access to at least one component housed within the chassis body.

In some examples, the sub-cover is positioned over a plurality of fans housed in the chassis body. Therefore, when in an open position, the sub-cover allows access to the plurality of fans.

In some examples, the sub-cover is slidable, and transitions from the closed position into the open position by sliding under the top cover. In other examples, the sub-cover is rotatably connected to the top cover. The sub-cover can rotate open towards a back portion of the top cover when the sub-cover transitions to an open position, for example.

In some examples, the top cover includes a pair of edge portions. Each edge portion extends over a side of the chassis body to secure the top cover to the chassis body.

In some examples, the handle is a slider latch.

A second embodiment of the present disclosure provides for a server rack that includes a plurality of chassis bodies and a plurality of cover apparatuses. Each cover apparatus corresponds to a chassis body in the plurality of chassis bodies. Each cover apparatus can be as provided for with respect to the first embodiment. Additional examples of the second embodiment can be as provided for with respect to the first embodiment.

A third embodiment of the present disclosure provides for a chassis body, which includes a plurality of components and a cover apparatus. The cover apparatus can be as provided for with respect to the first embodiment. Additional examples of the third embodiment can be as provided for with respect to the first embodiment.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The accompanying drawings exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

DETAILED DESCRIPTION

Figure 1A:
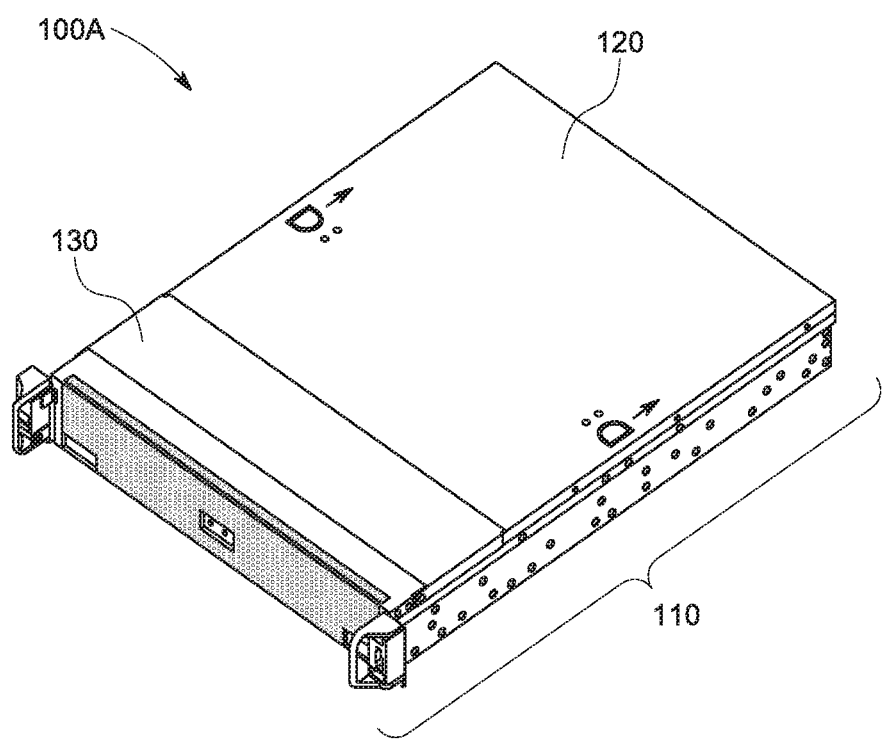
FIG. 1A shows a conventional computer chassis and cover design, according to the prior art.

The present invention is described with reference to the attached figures, where like reference numerals are used throughout the figures to designate similar or equivalent elements. The figures are not drawn to scale, and are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure is directed to a cover apparatus, including a top cover and a sub-cover. The top cover is received by, and extends over, the chassis body to protect the chassis body from air, dust, and any other external influences. The sub-cover is coupled to the top cover, and comprises a locking mechanism. The sub-cover alternates between an open position and a closed position, thereby allowing access to computer components housed within the chassis body. The sub-cover can be easily opened in order to repair or replace computer components without removing the entire top cover.

FIG. 1A shows a conventional computer chassis 100A, according to the prior art. The conventional chassis 100A comprises a chassis body 110, a first cover 120, and a second cover 130. FIG. 1A demonstrates that a conventional chassis cover requires two separate structures: a first cover 120 and a second cover 130. When both of these covers 120, 130 are closed (as shown in FIG. 1A), components within the chassis body 110 are protected from dust and external air circulation.

Figure 1B:
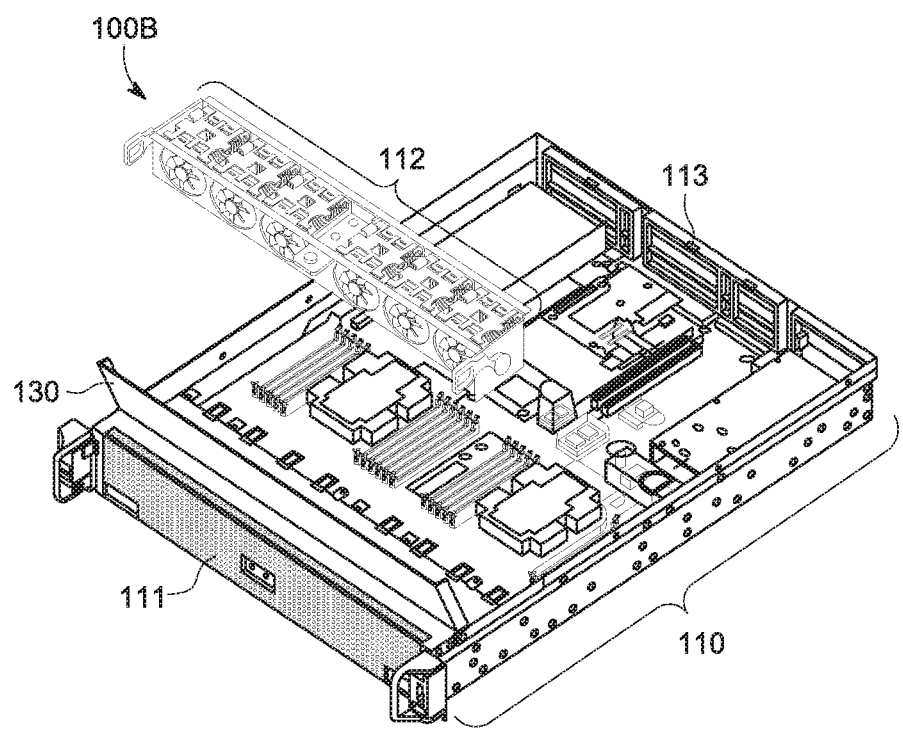
FIG. 1B shows a conventional cover with an open partition, according to the prior art.

FIG. 1B shows a conventional chassis 100B, where the first cover 120 is removed, and the second cover 130 is rotated open. In addition, FIG. 1B shows an array of computer fans 112. FIG. 1B shows that when a user wishes to access components within the chassis body 110, the first cover 120 can be removed, and the second cover 130 can be rotated open. Therefore, for example, an array of computer fans 112 can be removed from among a plurality of other computer components housed within the chassis body. In some examples, the first cover 120 can be affixed to the chassis body 110 by screws or other fastening mechanisms, which require external tools or apparatuses to remove. In some examples, the second cover 130 can be rotated open while the first cover 120 remains attached to the chassis body 110 (not pictured). The second cover 130 is permanently affixed to a front portion 111 of the chassis body 110.

FIG. 1B shows that the second cover 130 is rotated open away from a rear portion 113 of the chassis body 110 and towards a front portion 111 of the chassis body 110. Therefore, ease of access to the computer components housed within the chassis body 110 is restricted due to the presence of the second cover 130. This particularly affects the removal or installation processes for large computer components (for example, a motherboard) or any computer component with attached cabling. These access problems are exacerbated for large scale installation or removal projects when any entire server rack of chassis bodies 110 must be updated.

Figure 2A:
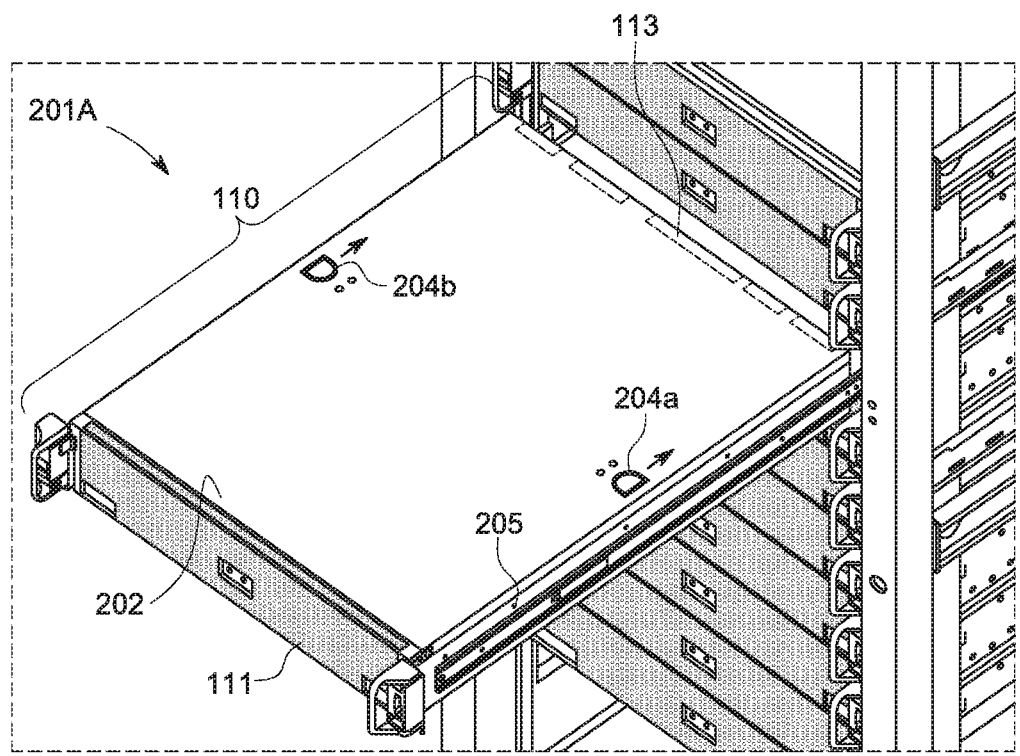
FIGS. 2A-2B show an exemplary chassis cover, according to an embodiment of the present disclosure.
Figure 2B:
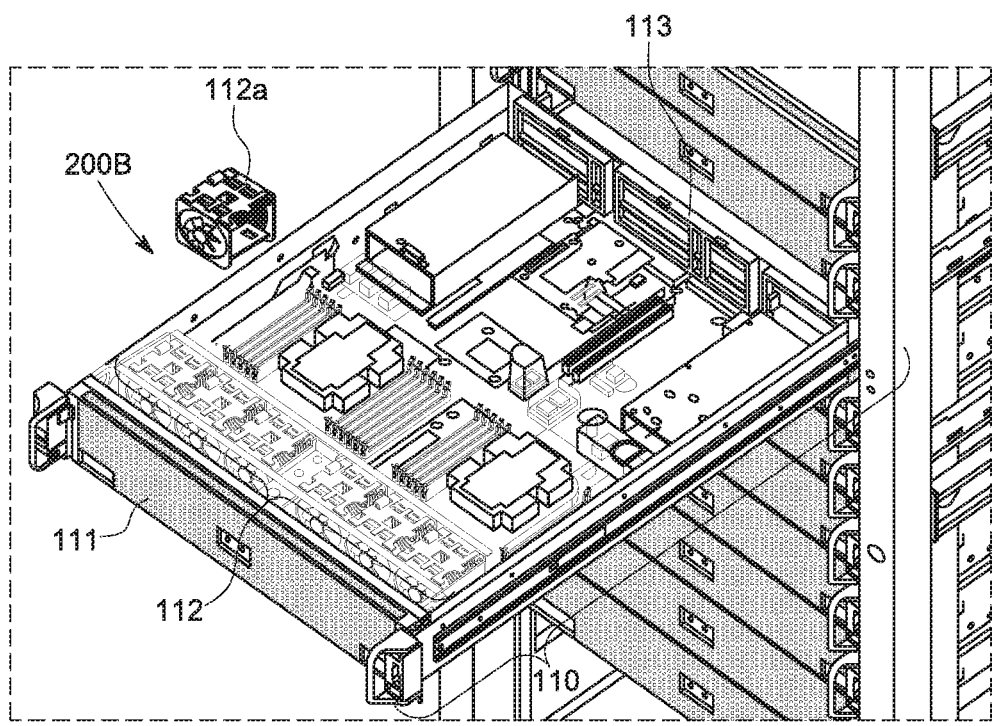

In order to address the deficiencies of the conventional cover designs, the present disclosure provides a new chassis cover. FIG. 2A shows an exemplary computer chassis 201A, which includes a chassis body 110 with a front portion 111 and a back portion 113; a top cover 202; side latches 204a and 204b; and side portion 205. FIG. 2B shows an exemplary computer chassis 200B where the top cover 202 is removed, revealing a plurality of computer components, including a fan 112a and an array of fans 112. FIGS. 2A-2B reveal similar aspects of the present disclosure, and are discussed in tandem below.

FIG. 2A shows the top cover 202 can be placed on top of a chassis body 110. The top cover 202 can extend over a full length and width of the chassis body 110 to fully seal computer components within the chassis body 110 from dust and external airflow. The top cover 202 can have side portions 205 extending over an edge of the chassis body 110. In some examples, the top cover 202 can lie flat on top of the chassis body 110, and be secured by the side portions 205. In other examples, the cover 202 can snap into place on top of the chassis body 110 as a function of the side portions 205.

Figure 2C:
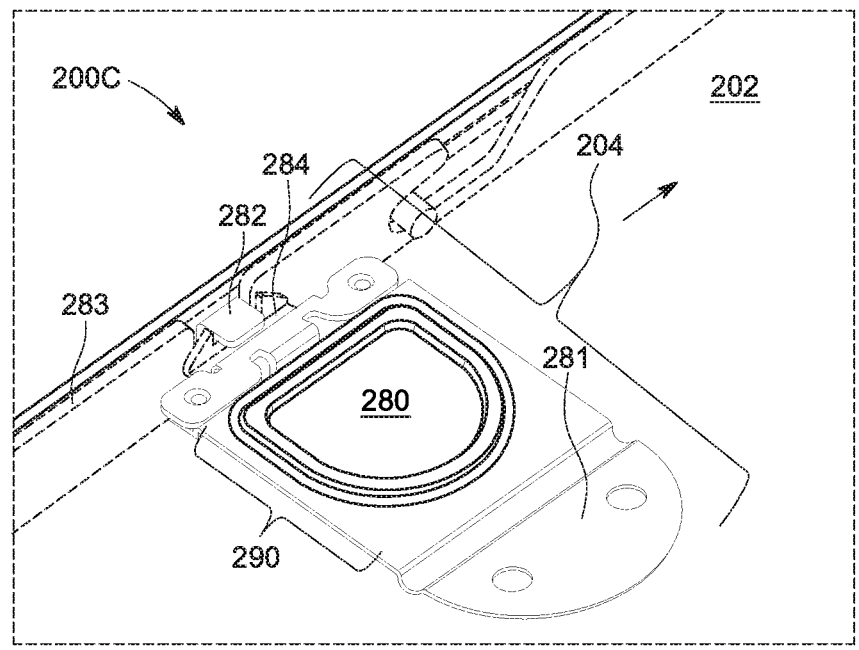
FIGS. 2C-2D show an exemplary side latch, according to an embodiment of the present disclosure.
Figure 2D:
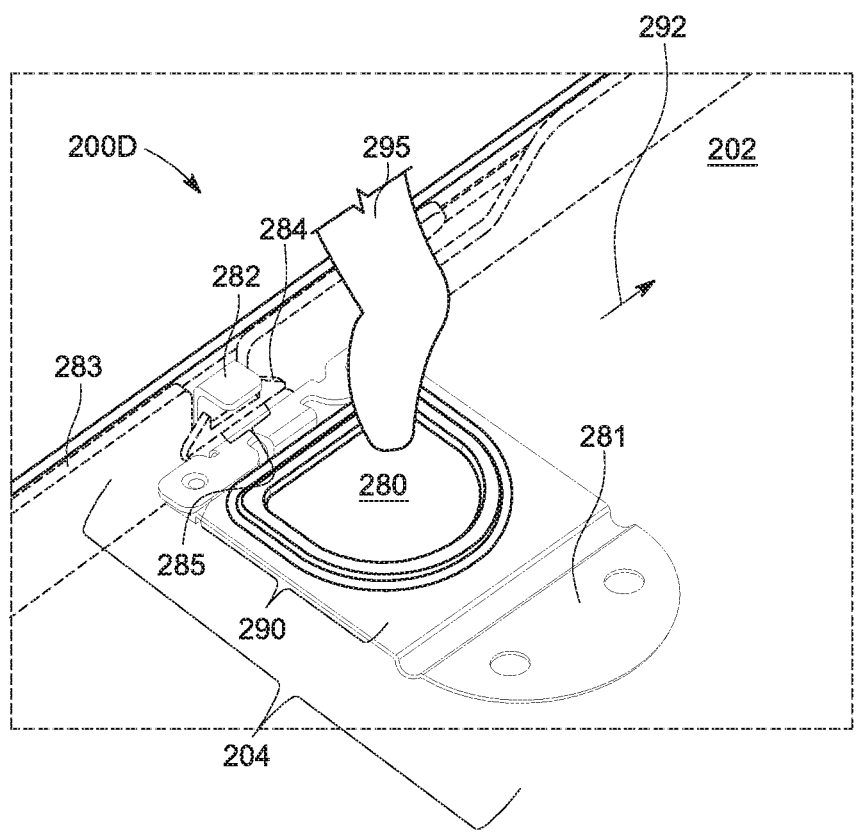

The top cover 202 additionally includes a pair of side latches 204a and 204b on either side of the chassis body 110. Referring momentarily to FIGS. 2C-2D, an exemplary latch apparatus 204 is shown. FIG. 2C shows an exemplary view of the apparatus 204 in a locked position 200C, and FIG. 2D shows an exemplary view of the apparatus 204 in an unlocked position 200D. FIGS. 2C-2D show a chassis cover 202, a button 280, a button housing 281, a stopping element 282, a chassis wall 283, a receiving element 284, and an first opening 285.

As shown in FIG. 2C, the latch apparatus 204 is in a locked, resting position 200C. In the locked, resting position 200C, no force is applied to the button 280. Therefore, a stopping element 282 is fully received by a first opening 285 in a receiving element 284. The receiving element 284 can be affixed to a button housing 281, which is secured to the chassis cover 202. The receiving element 284 is configured to receive the stopping element 282 such that no frontwards or backwards movement of the latch apparatus 204 is permitted in the locked position 200C. FIG. 2C further shows that the chassis cover 202 has a second opening 290; this second opening 290 corresponds to the button 280 such that a user can access the button 280 without removing the cover 202.

FIG. 2D demonstrates an unlocked position 200D of the latch apparatus 204. A user 295 can press down on the button 280. The receiving element 284 can be coupled to the button 280, such that downward movement of the button 280 causes the receiving element 284 to also move downwards. Therefore, the stopping element 282 is no longer received by the receiving element 284. While the user 295 is pressing down on the button 280, the user can slide the chassis cover 202 in direction 292. Therefore, the chassis cover 202 can be removed.

Referring now to FIG. 2B, system 200B demonstrates a removed top cover 202, which allows access to a plurality of computer components housed within the chassis body 110. For example, the chassis body 110 can house an array of fans 112. When the top cover 202 is removed, for example, fan 112a can be removed easily.

Figure 3A:
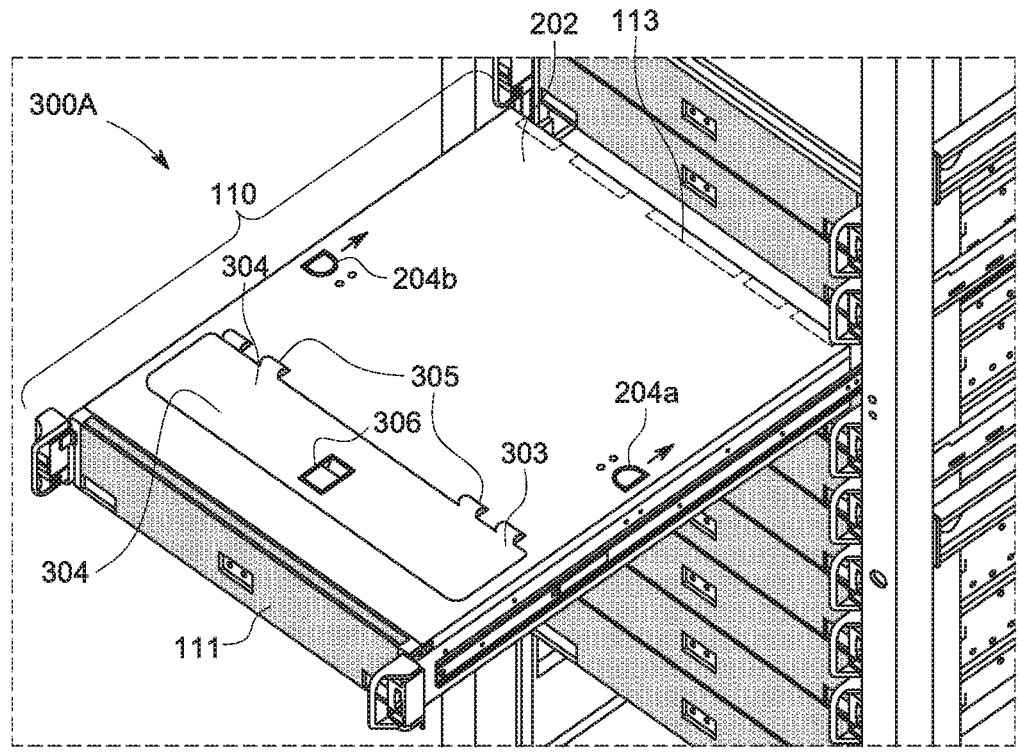
FIGS. 3A-3B show an exemplary chassis cover with a rotatable sub-cover, according to an embodiment of the present disclosure.
Figure 3B:
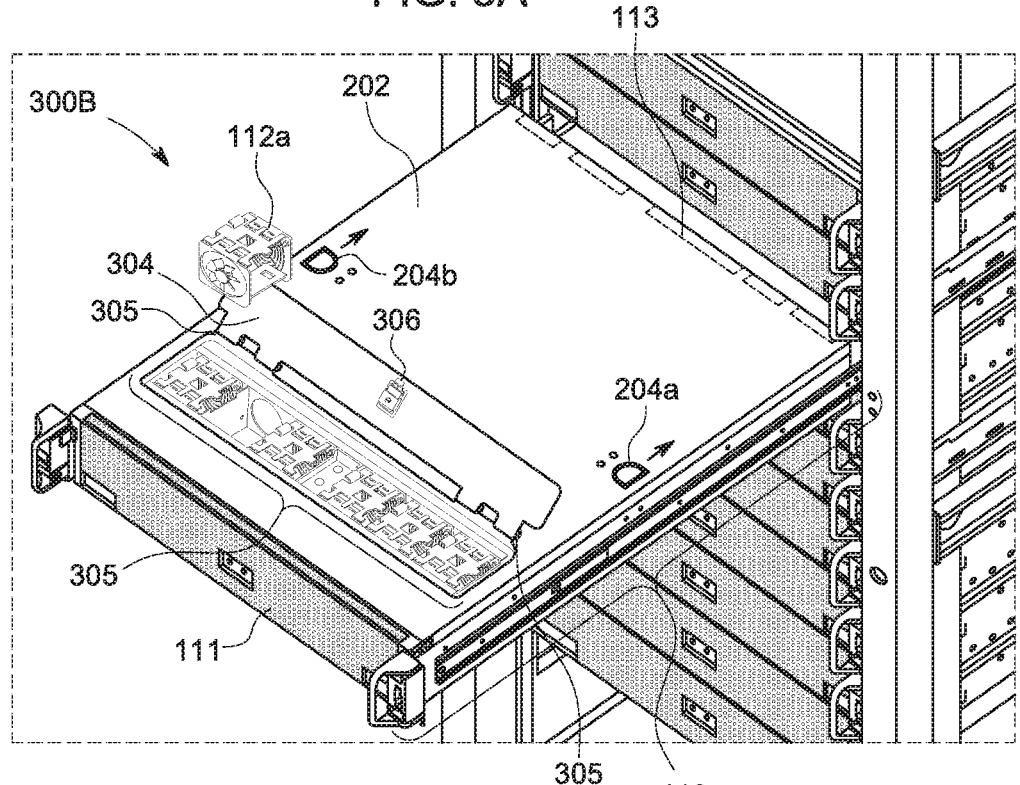

In some examples of the present disclosure, the top cover 202 includes a sub-cover positioned in the top cover 202 to allow access to a select set of computer components (for example, components that are frequently removed, replaced, or repaired). FIGS. 3A-3B show an exemplary sub-cover, according to an embodiment of the present disclosure. Chassis 300A of FIG. 3A shows many similar labels and components as chassis 201A and 200B of FIGS. 2A and 2B. In addition, chassis 300A shows a sub-cover 304, a locking mechanism 306, and a set of hinges 305.

The sub-cover 304 includes a locking mechanism 306, and is coupled to the top cover 202, for example, by a pair of hinges 305. The locking mechanism 306 can be any handle that allows a user to open and close the sub-cover 304. In some examples, the locking mechanism 306 locks the sub-cover 304 in the closed position (as shown in FIG. 3A). An exemplary locking mechanism is shown further with respect to FIG. 5A below.

The hinges 305 are affixed to the sub-cover 304 on a rear side 303 of the sub-cover 304, the rear side 303 being closest to a back portion 113 of the top cover 202. The sub-cover 304 alternates between a closed position (shown in FIG. 3A) and an open position (shown in FIG. 3B). The sub-cover 304 rotates open, via the hinges 305, away from a front portion 111 of the chassis body 110. This allows access to internal components without interference from the sub-cover 304. As shown in FIG. 3B, an array of fans 112 can be accessed, and a particular fan 112a is easily accessible from a front side 111 of the chassis body 110.

Although sub-cover 304 is shown to be positioned over an array of fans 112 close to a front portion 111 of the chassis body 110, the present disclosure contemplates that an exemplary sub-cover 304 can be positioned anywhere on the top cover 202. For example, the exemplary sub-cover 304 can be located along back portion 113 or along side portions of the top cover 202, adjacent to the side latches 204a and 204b. In some examples, the sub-cover will be positioned over computer components that a user requires frequent access to. Additionally, although sub-cover 304 is shown in FIGS. 3A-3B to be of a particular size (for example, corresponding to the size of the array of fans 112), the present disclosure contemplates that the sub-cover 304 can be of any size. In some examples, the size of the sub-cover 304 corresponds to sizes of a particular computer component housed in the chassis body 110. For example, the sub-cover 304 can be sized according to the size of a motherboard, a central processing unit, a graphics processing unit, a power supply, a power supply cable, and/or any other computer component as known in the art. In some examples, the sub-cover 304 allows access to a plurality of computer components, and is sized, and located, accordingly.

Therefore, FIGS. 3A-3B demonstrate superior functionality to the conventional cover apparatus shown in FIGS. 1A-1B. FIGS. 1A-1B show how a second cover 130 impedes access to the components inside the chassis body 110; this is not the case for the cover apparatus of the present disclosure as shown in FIGS. 3A-3B.

Figure 4A:
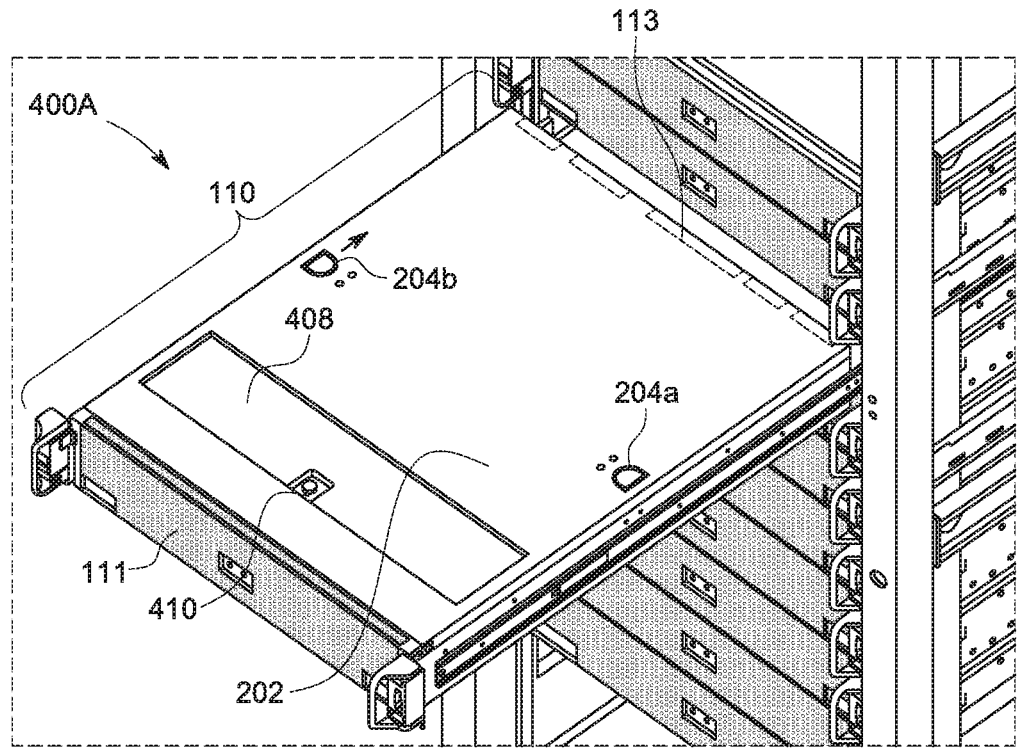
FIGS. 4A-4B show an exemplary chassis cover with a slidable sub-cover, according to an embodiment of the present disclosure.
Figure 4B:
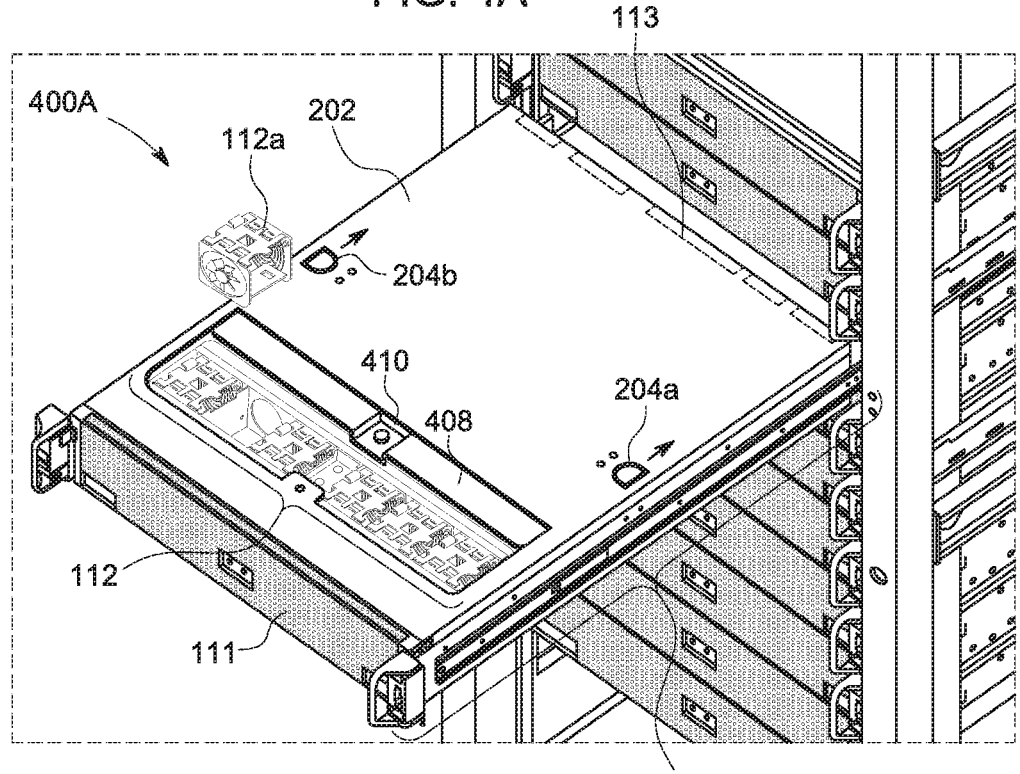

FIGS. 4A-4B show a slidable sub-cover, according to another embodiment of the present disclosure. Chassis 400A of FIG. 4A shows many similar labels and components as chassis 201A and 200B of FIGS. 2A and 2B. In addition, chassis 400A includes a sub-cover 408 and a locking mechanism 410. The sub-cover 408 can be transitioned between a closed position (shown in FIG. 4A) and an open position (shown in FIG. 4B). The sub-cover 408 slidably moves between positions. The sub-cover 408 can be moved between positions via a locking mechanism 410. The locking mechanism 410 can be any mechanism configured for a user to operate. In some examples, the locking mechanism 410 can lock the sub-cover in the closed position (as shown in FIG. 4A). An exemplary locking mechanism 410 is discussed further with respect to FIG. 5B below.

Altogether, sub-cover 408 of FIGS. 4A-4B provides similar advantages as sub-cover 304 of FIGS. 3A-3B, including ease of access to computer components and a lack of interference from the sub-cover 408 when a user is accessing components in the chassis body 110. In addition, sub-cover 408 can have the same alternate characteristics discussed with respect to sub-cover 304 of FIGS. 3A-3B, including: (1) sub-cover 408 can be positioned anywhere on the top cover 202; (2) sub-cover 408 can be of any size; and (3) sub-cover 408 can be sized and placed to correspond to particular computer components housed within chassis body 110.

Figure 5A:
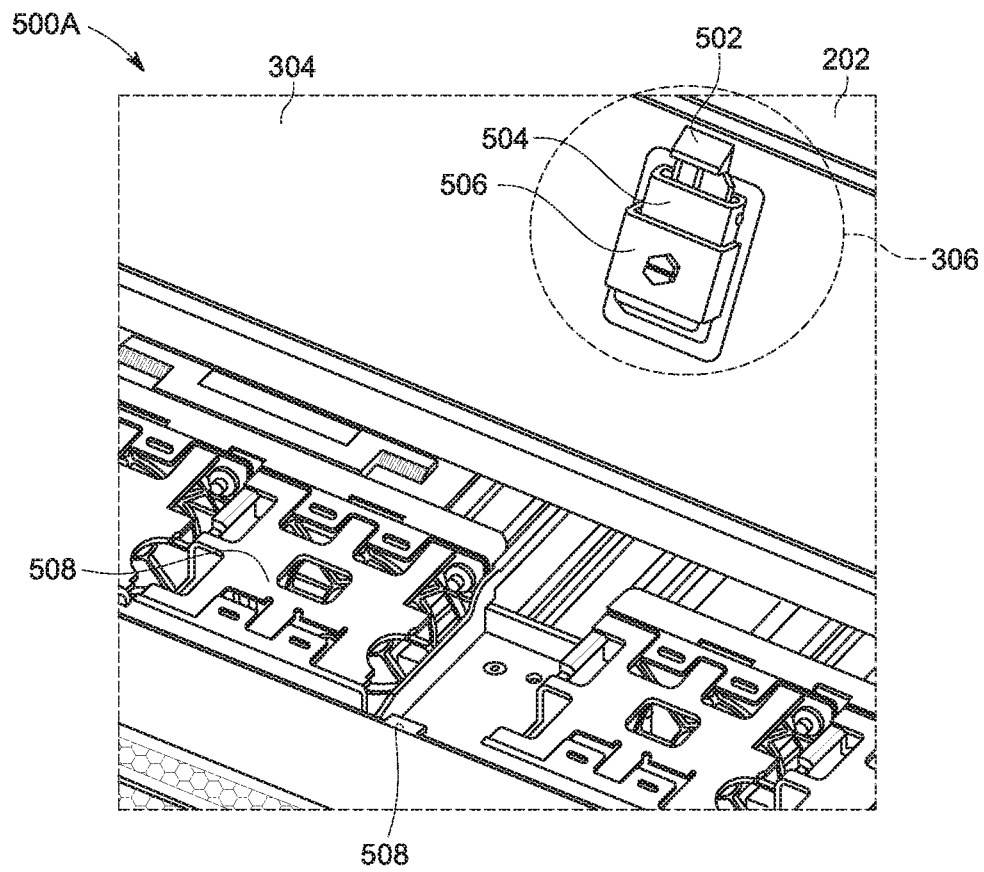
FIG. 5A shows an exemplary slider latch, according to an embodiment of the present disclosure.

FIG. 5A shows an exemplary slider latch apparatus 500A, according to an embodiment of the present disclosure. The slider latch apparatus 500A can include a locking mechanism 306, a hook 502, a body 504, a housing 506, and a receiving element 508. For example, the slider latch apparatus 500A can be used in chassis 300A and 300B of FIGS. 3A and 3B respectively. The apparatus 500A includes a body 504, which moves back and forth within a housing 506. For example, the body 504 can be moved by a user. The body 504 can include a hook 502, which can be received by a receiving element 508. For example, the receiving element 508 can be an indented portion, an option, or an opening. The hook 502 can be received by the receiving element 508 when the sub-cover 304 is in a closed position, for example. When the hook 502 is received by the receiving element 508, the apparatus 500A can be locked; the apparatus 500A can be unlocked by a user pulling on the body 504 so that the hook 502 comes out of the receiving element 508.

Figure 5B:
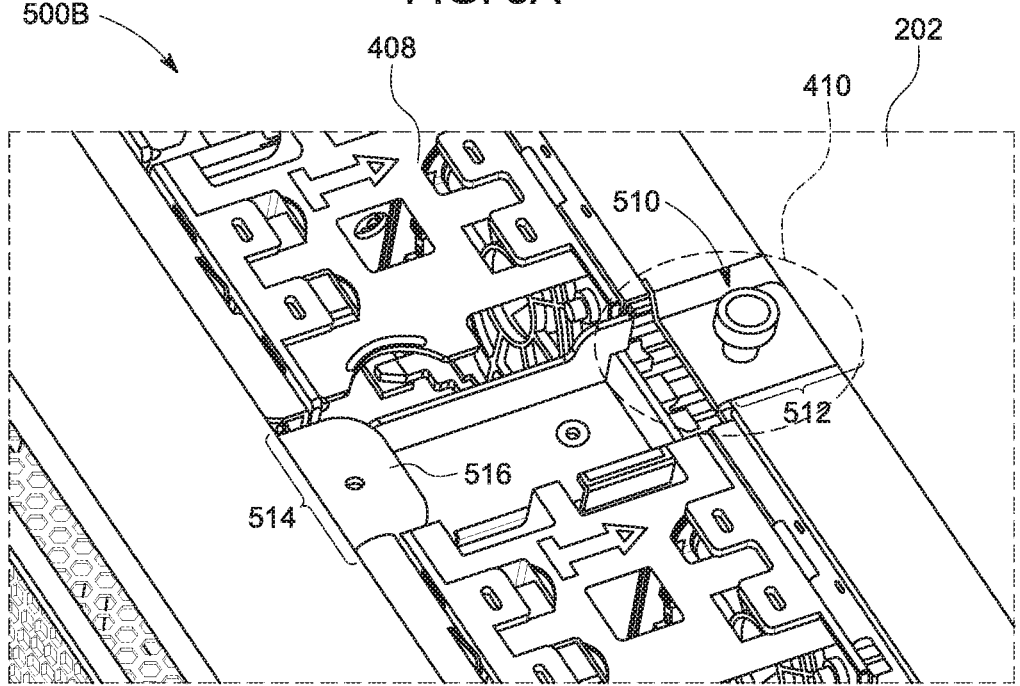
FIG. 5B shows an exemplary locking mechanism, according to an embodiment of the present disclosure.

FIG. 5B shows an exemplary locking mechanism 500B. The locking mechanism 500B can include a thumb screw 510, an indented portion 512, a receiving element 514, and an opening 516. The locking mechanism 500B can be used to move a sliding sub-cover 408 between an open position (shown in FIG. 4B) and a closed position (shown in FIG. 4A). For example, the locking mechanism 500B can be locking mechanism 410, as shown in FIGS. 4A-4B. The locking mechanism 500B can include an indented portion 512 with a thumb screw 510. When in the closed position, the thumb screw 510 can be received by the opening 516 in the receiving element 514. For example, the opening 516 can be a tapping extrude in which the thumb screw 510 can be fastened. In some examples, the thumb screw 510 locks the sub-cover 408 in the closed position. The thumb screw 510 can be pulled, for example, by a user to unlock the sub-cover 408, and allow the sub-cover 408 to transition to the open position.

Although an exemplary latch apparatus 500A and locking mechanism 500B are shown in FIGS. 5A and 5B respectively, any latches, securing elements, and/or fasteners, as known in the art, can be used in the cover apparatuses shown in FIGS. 3A-4B. In some examples, no latches, securing elements, and/or fasteners will be used. Altogether, the handle apparatuses exemplary latch apparatus 500A and locking mechanism 500B allow a user to quickly access components within a chassis body 110 without: (1) using an external tool to open the sub-covers; or (2) removing the entire top-cover.

While various examples of the present invention have been described above, it should be understood that they have been presented by way of example only, and not limitation. Numerous changes to the disclosed examples can be made in accordance with the disclosure herein without departing from the spirit or scope of the invention. Thus, the breadth and scope of the present invention should not be limited by any of the above described examples. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A cover apparatus for a chassis body, comprising:
a top cover configured to be received by the chassis body, the top cover extending over a full length and width of the chassis body; and
a sub-cover mechanically coupled to the top cover and comprising a handle, wherein the sub-cover is configured to alternate between an open position and a closed position, wherein the open position provides access to at least one component housed within the chassis body.

2. The cover apparatus of claim 1, wherein the sub-cover is positioned over a plurality of fans housed in the chassis body.

3. The cover apparatus of claim 1, wherein the sub-cover is slidably received under the top cover in the open position.

4. The cover apparatus of claim 1, wherein the top cover further comprises a pair of edge portions, wherein each edge portion extends over a side of the chassis body.

5. The cover apparatus of claim 1, wherein the handle further comprises a slider latch.

6. A server rack, comprising:
a plurality of chassis bodies; and
a plurality of cover apparatuses, each cover apparatus of the plurality of cover apparatuses corresponding to a chassis body in the plurality of chassis bodies, wherein each cover apparatus in the plurality of cover apparatuses further comprises:
a top cover configured to be received by the corresponding chassis body, the top cover extending over a full length and width of the corresponding chassis body; and
a sub-cover coupled to the top cover and comprising a handle, wherein the sub-cover is configured to alternate between an open position and a closed position, wherein the open position provides access to at least one component housed within the corresponding chassis body.

7. The server rack of claim 6, wherein the sub-cover is positioned over a plurality of fans housed in the corresponding chassis body.

8. The server rack of claim 6, wherein the sub-cover is slidably received under the top cover in the open position.

9. The server rack of claim 6, wherein the sub-cover is rotatably coupled to the top cover.

10. The server rack of claim 9, wherein the sub-cover is rotated away from a front portion of the top cover in the open position.

11. The server rack of claim 6, wherein the top cover further comprises a pair of edge portions, wherein each edge portion extends over a side of the corresponding chassis body.

12. The server rack of claim 6, wherein the handle further comprises a slider latch.

13. A chassis body, comprising:
a plurality of components; and
a cover apparatus, wherein the cover apparatus further comprises:
a top cover configured to be received by the chassis body, the top cover extending over a full length and width of the chassis body; and
a sub-cover coupled to the top cover and comprising a handle, wherein the sub-cover is configured to alternate between an open position and a closed position, wherein the open position provides access to at least one component housed within the corresponding chassis body.

14. The chassis body of claim 13, wherein the sub-cover is positioned over a plurality of fans housed in the chassis body.

15. The chassis body of claim 13, wherein the sub-cover is slidably received under the top cover in the open position.

16. The chassis body of claim 13, wherein the sub-cover is rotatably coupled to the top cover.

17. The chassis body of claim 16, wherein the sub-cover is rotated away from a front portion of the top cover in the open position.

18. The chassis body of claim 13, wherein the top cover further comprises a pair of edge portions, wherein each edge portion extends over a side of the chassis body.

19. A cover apparatus for a chassis body, comprising:
a top cover configured to be received by the chassis body, the top cover extending over a full length and width of the chassis body; and
a sub-cover rotatably coupled to the top cover and comprising a handle, wherein the sub-cover is configured to alternate between an open position and a closed position, wherein the open position provides access to at least one component housed within the chassis body.

20. The cover apparatus of claim 19, wherein the sub-cover is rotated away from a front portion of the top cover in the open position.

* * * * *